United States Patent
Nguyen et al.

(10) Patent No.: US 8,842,032 B2
(45) Date of Patent: Sep. 23, 2014

(54) ENHANCED SECOND ORDER NOISE SHAPED SEGMENTATION AND DYNAMIC ELEMENT MATCHING TECHNIQUE

(71) Applicants: Khiem Quang Nguyen, Tewksbury, MA (US); Robert Adams, Acton, MA (US)

(72) Inventors: Khiem Quang Nguyen, Tewksbury, MA (US); Robert Adams, Acton, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 13/774,700

(22) Filed: Feb. 22, 2013

(65) Prior Publication Data

US 2014/0152480 A1 Jun. 5, 2014

Related U.S. Application Data

(60) Provisional application No. 61/731,970, filed on Nov. 30, 2012.

(51) Int. Cl.
*H03M 1/66* (2006.01)

(52) U.S. Cl.
CPC ........................................ *H03M 1/66* (2013.01)
USPC ........................................ 341/144; 341/120

(58) Field of Classification Search
CPC ................................ H03M 1/66; H03M 1/109
USPC .......................................... 341/118, 120, 144
See application file for complete search history.

(56) References Cited

U.S. PATENT DOCUMENTS

| | | | |
|---|---|---|---|
| 5,406,283 A * | 4/1995 | Leung ........................... | 341/143 |
| 5,684,482 A | 11/1997 | Galton | |
| 7,079,063 B1 | 7/2006 | Nguyen et al. | |
| 7,132,968 B2 * | 11/2006 | Wang et al. .................... | 341/143 |
| 7,719,455 B2 * | 5/2010 | Kim et al. ...................... | 341/144 |
| 7,777,658 B2 | 8/2010 | Nguyen et al. | |
| 7,812,753 B1 * | 10/2010 | Myles et al. ................... | 341/144 |
| 8,410,965 B2 * | 4/2013 | Chang et al. ................... | 341/144 |

OTHER PUBLICATIONS

Rakuljic and Galton, "Tree-Structured DEM DACs with Arbitrary Numbers of Levels," IEEE Transactions on Circuits and Systems—I: Regular Papers, vol. 57, No. 2, pp. 313-322, Feb. 2010.
PCT International Search Report and Written Opinion or PCT/US2013/071006, mailed on Jan. 22, 2014, 7 pages.

* cited by examiner

*Primary Examiner* — Brian Young
(74) *Attorney, Agent, or Firm* — Kenyon & Kenyon LLP

(57) ABSTRACT

A method and circuit to perform noise shaped splitting of a digital input signal may include using multiple layers to process the input signal. In the first layer, the most significant bits of the input signal may be distributed to a plurality of branches. Dynamic element matching may be performed using the least significant bits of the input signal. Based on the results of the dynamic element matching, values may be added to the plurality of branches. If there is insufficient data activity, dynamics enhancement may be performed to increase the data activity. The output signals of each of the plurality of branches in the first layer may be provided to a second layer, in which these steps can be repeated on each of the output signals. The outputs of the second layer may be provided to a plurality of three level unit elements.

23 Claims, 8 Drawing Sheets

100
(Prior Art)

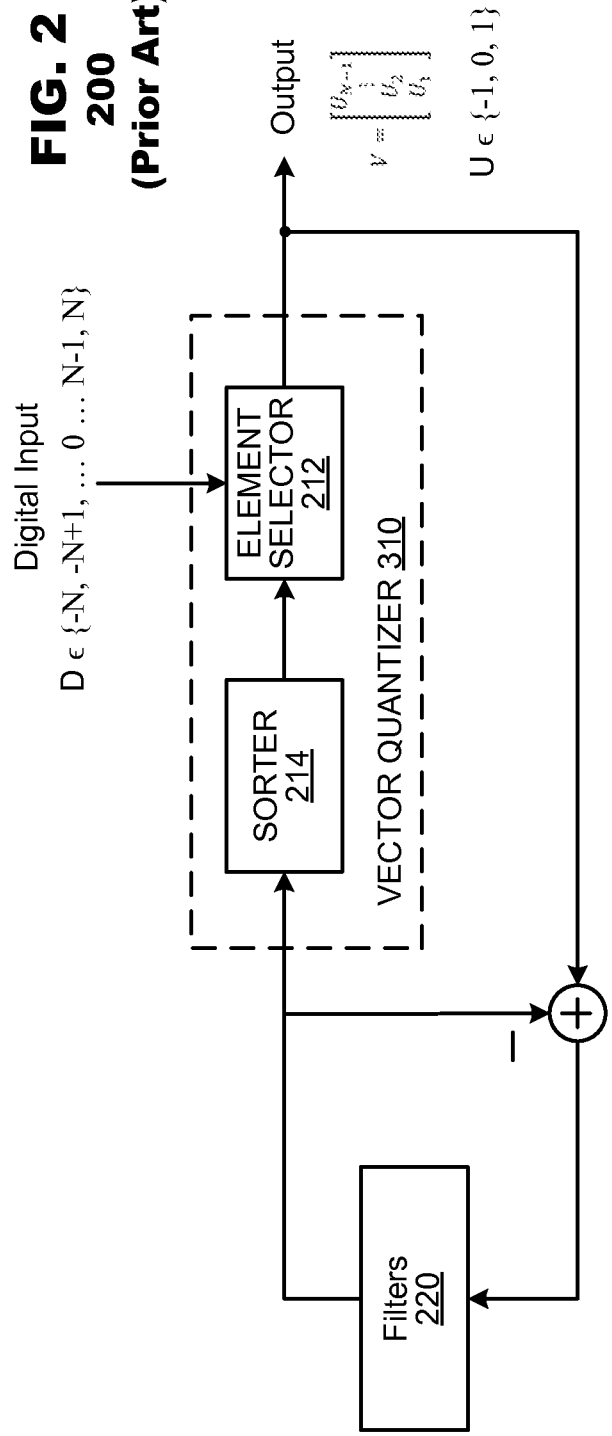

300

400

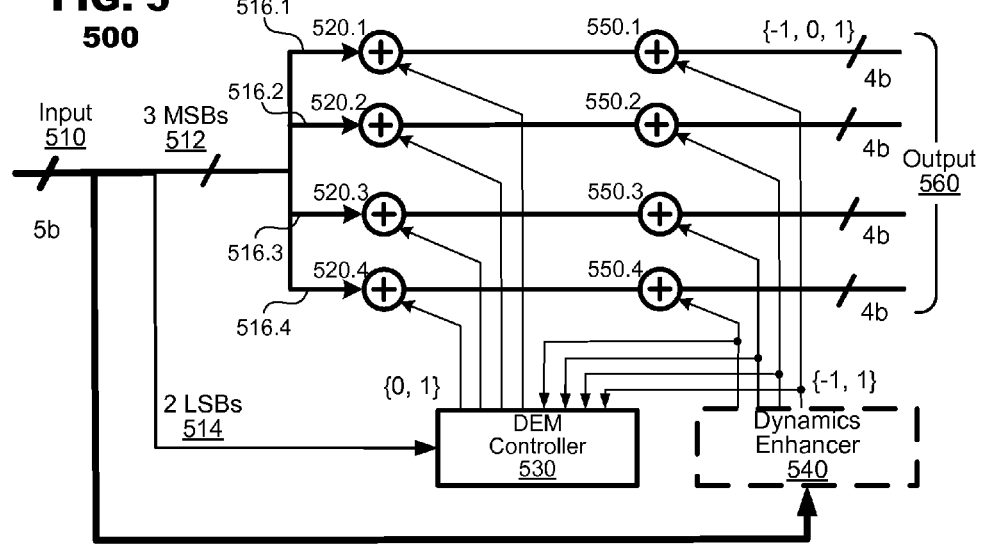
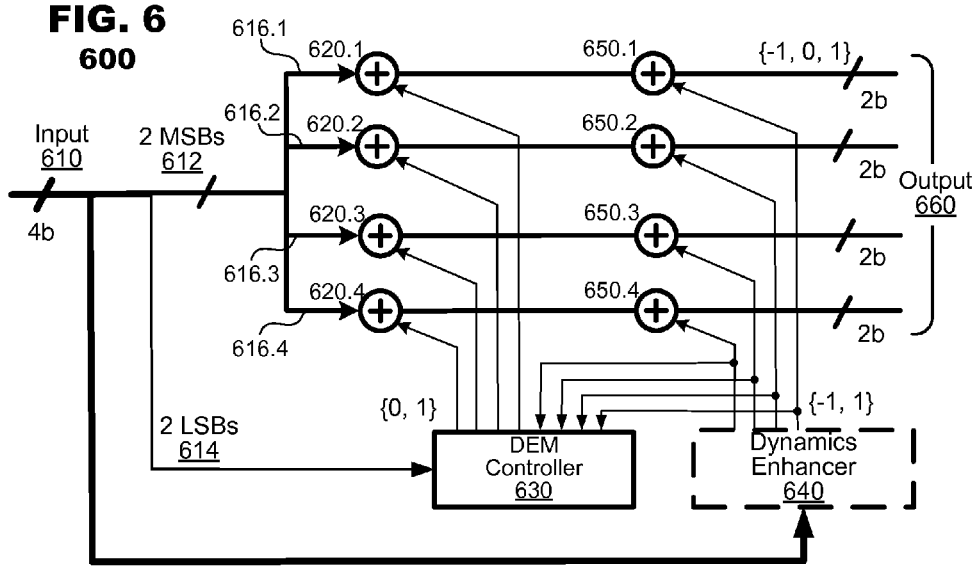

700

800

900

ENHANCED SECOND ORDER NOISE SHAPED SEGMENTATION AND DYNAMIC ELEMENT MATCHING TECHNIQUE

CROSS-REFERENCE TO RELATED APPLICATION

This application claims the benefit of priority afforded by U.S. Provisional Application Ser. No. 61/731,970, filed Nov. 30, 2012, the entirety of which is incorporated by reference herein.

BACKGROUND

The subject matter of this application is directed to mixed-signal converters of the sigma-delta ($\Sigma\Delta$) noise shaping type, and more particularly, to mixed-signal digital-to-analog converters (DACs) that employ uniformly weighted elements.

Multi-bit sigma-delta DACs are widely used to reconstruct high precision analog signals in a stand-alone digital-to-analog conversion, or as a part of an analog-to-digital conversion circuit. The mismatch of the uniformly-weight analog elements, as a result of circuit imperfections, in this type of DAC introduces harmonic distortions that severely degrade the performance of the converter. Dynamic element matching (DEM) techniques have been used to improve the converter signal-to-noise ratio by either spectrally flattening out, or better yet, converting the harmonic distortions into a high-passed noise, which is beyond the signal bandwidth. As a result, the signal-to-noise ratio (SNR) and total-harmonic-distortion (THD) of the converter are greatly improved.

However, existing digital-to-analog conversion methods still suffer from $2^{nd}$-order DEMs not being able to shape higher order noise, requiring higher over-sampling ratios (OSR), and not being able to effectively handle low level signals. In addition, existing $2^{nd}$-order DEM logic take up large amount of space and do not work with three-level unit elements.

Accordingly, the inventors have identified a need in the art to increase the effectiveness of higher order DEMs which can achieve higher order noise shaping even at low signal levels, which are area-efficient, and which are able to operates with three-level unit elements.

BRIEF DESCRIPTION OF THE DRAWINGS

So that features of the present invention can be understood, a number of drawings are described below. It is to be noted, however, that the appended drawings illustrate only particular embodiments of the invention and are therefore not to be considered limiting of its scope, for the invention may encompass other equally effective embodiments.

FIG. 2 illustrates a generalized $2^{nd}$-order DEM logic.

FIGS. 5 and 6 illustrate exemplary splitting circuits that may find application with a DEM DAC circuit according to an exemplary embodiment of the present disclosure.

DETAILED DESCRIPTION

Embodiments of the present invention include methods and circuits to perform noise shaped splitting of a digital input signal using multiple layers. In an embodiment using two layers, in the first layer, the most significant bits of the input signal may be distributed to a plurality of branches. Dynamic element matching may be performed using the least significant bits of the input signal. Based on the results of the dynamic element matching, values may be added to the plurality of branches. The input signal may be analyzed to determine if there is sufficient data activity. If there is insufficient data activity, dynamics enhancement may be performed to increase the data activity. The output signals of each of the plurality of branches in the first layer may be provided to a second layer, in which these steps can be repeated on each of the output signals. The outputs of the second layer may be provided to a plurality of three level unit elements. The plurality of three level unit elements can either be positively selected, negatively selected or not selected based on the output value of each of the outputs.

Figure 1A:
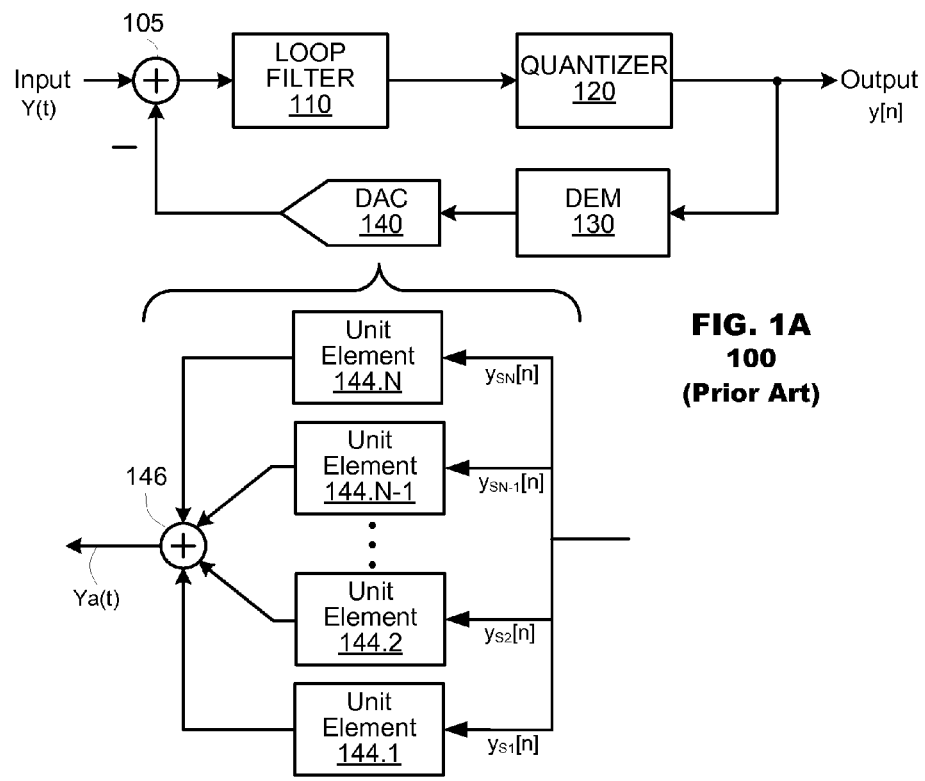
FIGS. 1A-1C illustrate a typical multi-bit noise-shaped oversampling ADC and different unit elements which can be used in the DAC.

A typical multi-bit noise-shaped oversampling ADC 100 is shown in FIG. 1A. The ADC 100 may include an adder 105, a loop filter 110, a quantizer 120, a dynamic element matching (DEM) logic block 130 and a feedback DAC 140. The feedback DAC 140 may include a number of unit elements 144.1-144.N and an adder 146. The ADC 100 may receive an analog input signal y(t) and generate an N-valued digital output y[n], a digital representation of the input signal y(t). The input signal y(t) may be compared to the output ya(t) of the DAC 140 via adder 105. The output signal from the adder 105 can be filtered by loop filter 110, which may effectively perform an integration on the signal output from the adder 105. An output from the loop filter 110 may be fed to the quantizer 120 that provides the N-valued digital output y[n].

The DEM logic block 130 may map the N-valued digital output y[n] into N 1-bit sequences denoted $y_{S1}[n]$–$y_{SN}[n]$. The outputs of the DEM logic block 130 may be routed to the unit elements 144.1-144.N. Each of the unit elements 144.1-144.N may convert the signal received from the DEM logic block 130 into analog signals and the outputs of each of the unit elements 144.1-144.N may be summed via adder 146 to produce output signal ya(t).

The ADC 100 includes a DEM logic block 130 to linearize the element-to-element mismatch. The DEM logic block 130 applies a highpass function on the element 144.1-144.N mismatch error, thus yielding very little in-band mismatch noise so as not to degrade the SNR of the converter. To date, there have been many publications in literature showing various ways to implement DEM with two-level unit-element architecture.

One of the main noise contributors in the ADC design is the feedback DAC 140. Reducing the thermal noise contribution from the DAC 140 will greatly enhance the signal-to-noise ratio (SNR) of the ADC 100. In a stand-alone DAC applications three-level unit-element multi-bit architecture are used to reduce the element thermal noise contribution, thus improving the overall SNR of the DAC.

Figure 1B:
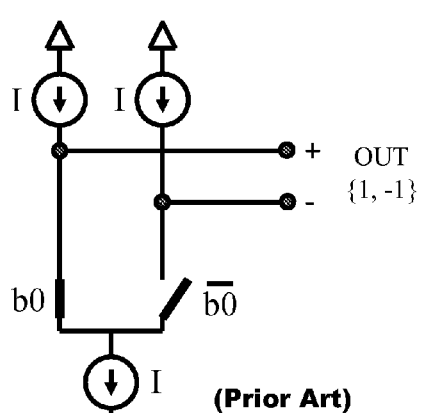
Figure 1C:
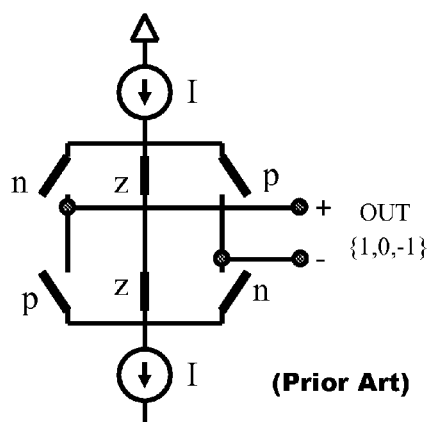

FIGS. 1B and 1C illustrate a conventional two-level and a three-level unit element. As shown in FIG. 1B, a two-level unit element can only produce 2 analog quantities "+1" and a "−1." Whereas, as shown in FIG. 1C, a three-level element can produce "+1", "0" and "−1". A 1-bit word is sufficient to represent two-level data, whereas a 2-bit word is needed to represent three-level data. Decoded values "p", "n" and "z" represent the positive, negative and zero digital input which are applied to the three-level element. As shown in FIG. 1C, with a digital "0" input, the three-level current sources do not get connected to the output. Therefore, when with a digital "0" input, the three-level current sources do not contribute noise to the output. In contrast, with the two-level unit element, the noise from the current sources is always present in the output. Using the three-level unit element DAC in an ADC design will greatly improve the SNR of the ADC. Other advantages include the reduction in the capacitor size of the continuous-time integrators, and relaxed drive strength requirement due to higher input ADC impedance.

DEM techniques have also been proposed for three-level unit-elements. These techniques implement a $1^{st}$-order DEM performing a $1^{st}$-order highpass function on the element mismatch error. For any $1^{st}$-order DEM technique to be effective, the over-sampling ratio (OSR), the ratio between the sampling rate of the modulator and the Nyquist rate, must be adequately high (e.g., at least 64 times). Otherwise, the shaped mismatch error may start to degrade the SNR of the converter. However, operating the modulator with high clock rate is not desirable for many reasons, such as higher power consumption, higher operating clock rate on the digital decimation filter, and more stringent requirements on the analog components in the modulator such as op-amps or comparator. Thus, it is desirable to operate the modulator with a lower OSR to avoid these drawbacks. With lower OSRs, higher order DEMs should be used because at low OSRs $1^{st}$-order DEMs become ineffective. Therefore, there is a need for a $2^{nd}$-order DEM logic that works with three-level unit elements, that does not require a high OSR.

FIG. 2 illustrates a generalized $2^{nd}$-order DEM logic 200. The $2^{nd}$-order DEM logic 200 may include a vector quantizer 210 and filters 220. The vector quantizer 210 may include an element selector 212 and sorter 214. The vector quantizer 210 receives a digital input and provides a vector providing signals for the unit elements (e.g., −1, 0 or 1 for a three-level unit element). One of the disadvantages is that the vector quantizer 210 takes a significant silicon area due to the complexity associated with the sorting algorithm of the sorter 214. U.S. Pat. No. 5,684,482 teaches a technique to segment the N number of elements into a binary tree shape, therefore eliminating the vector quantizer. However, the issue with this approach is that for high input level, the $2^{nd}$-order DEM logic reverts back to a $1^{st}$-order DEM due to the saturation of the $2^{nd}$-order integrator associated with individual modulators. Therefore, the tree-structure essentially can only produce a $1^{st}$-order highpass shaping to the element mismatch error. Moreover, it does not work with three-level unit elements.

In addition, existing implementations of the $2^{nd}$-order DEM logic on three-level unit elements may not be effective at low input levels. At low input levels, when only a few unit elements are used, the DEM has very few options to correct for the mismatch. Thus, the DEM is very susceptible to poor noise shaping of the element mismatch.

Accordingly, there is a need in the art to increase the effectiveness of higher order DEMs which can achieve higher order noise shaping even at low signal levels, which are area-efficient, and which are able to operates with three-level unit elements.

The embodiments of the present invention present a $2^{nd}$-order DEM logic which can achieve $2^{nd}$-order highpass shaping at all input signal conditions, which is area-efficient, and is able to operate with three-level unit elements. The various embodiments are shown to work with, but not limited to, a current steering DAC within a continuous-time modulator. Those skilled in the art would find its applicability in other DAC such as switched capacitor, or switched resistor type.

Figure 3:
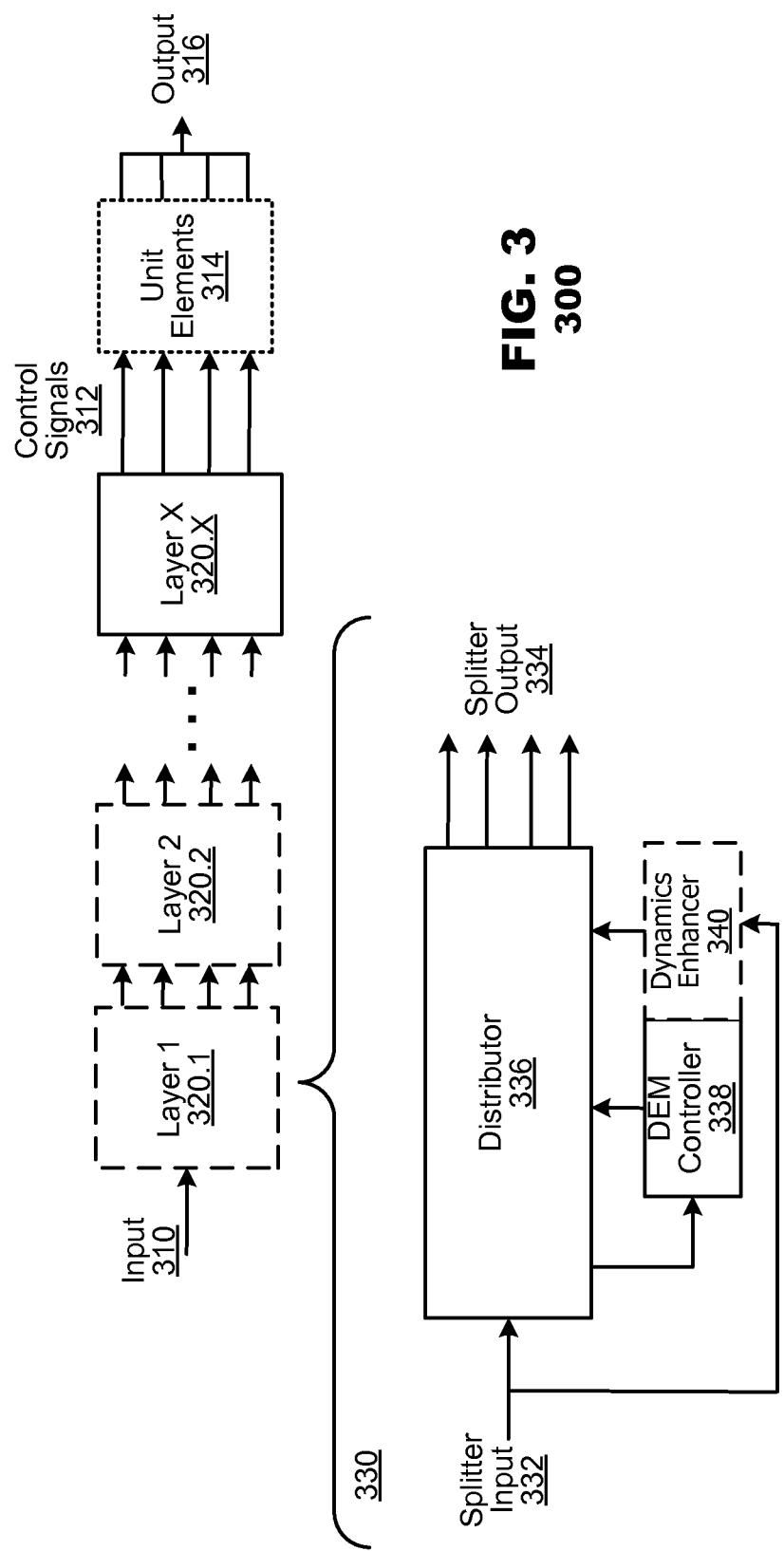
FIG. 3 illustrates a block diagram of an exemplary splitting circuit that may find application with a circuit according to an exemplary embodiment of the present disclosure

FIG. 3 illustrates a block diagram of an exemplary DEM DAC circuit 300 that may find application with a circuit according to an exemplary embodiment of the present disclosure. The DEM DAC circuit 300 may receive an input signal 310 and provide a plurality of control signals 312 to control the operation of a plurality of unit elements 314. The control signals 312 may control the unit elements 314 to provide an analog output signal 316 representative of the input signal 310. Each of the control signals 312 may be a two bit word, representing a three level signal (e.g., −1, 0, 1). Each control signal 312 can be an element selection signal provided to a three level unit element 314 that can be either positively selected, negatively selected or not selected. The unit elements 314 may be provide a positive charge, a negative charge, or no charge to the output signal 316.

The input signal 310, which may be a binary (e.g., signed binary) or a thermometer code, may be split by the DEM DAC circuit 300 via one or more layers 320.1-X. Each output of the preceding layer may be split by additional layers such that the final layer 320.X outputs the plurality of control signals 312 to control the operation of the plurality of unit elements 314. The splitting may include noise shaped splitting (or segmentation). The plurality of layers 320.1-X may form a tree-structured pattern splitting the input signal 310 to provide control signals 312.

Each layer 320.1-X may include one or more splitting circuits 330. The splitting circuits 330 may include a distributor 336 and a DEM controller 338. The distributor 336 may receive a splitter input signal 332 and provide a plurality of splitter output signals 334 representing the splitter input signal 332. The splitter input signal 332 and the splitter output signals 334 may be a binary (e.g., signed binary) or a thermometer code. The splitter output signals 334 may be used to control unit elements 314 if the splitting circuit is part of the last layer. Each of the splitter output signals 334 may be a digital output having a lower number of bits than the splitter input signal 332.

The distributor 336 may perform noise shaped splitting of the splitter input signal 332 into smaller words. The DEM controller 338 may perform dynamic element matching based on the input signal to randomize the mismatch error or shape the mismatch error such that it is pushed out of a frequency of interest. The dynamic element matching may include adding a value to one or more of the split input signal for dynamic element matching. The splitting circuits 330 may include a dynamics enhancer circuit 340 to increase the data activity if it is determined that there is insufficient data activity in the splitter input signal 332.

The exemplary circuits provide a second order DEM DAC that can be used with three level unit elements 314. The exemplary circuits and methods using these circuits are hardware efficient and can be applied to lower over sampling ratios. In addition, the performance of these exemplary circuits can be independent of the data activity in the input signals.

Figure 4:
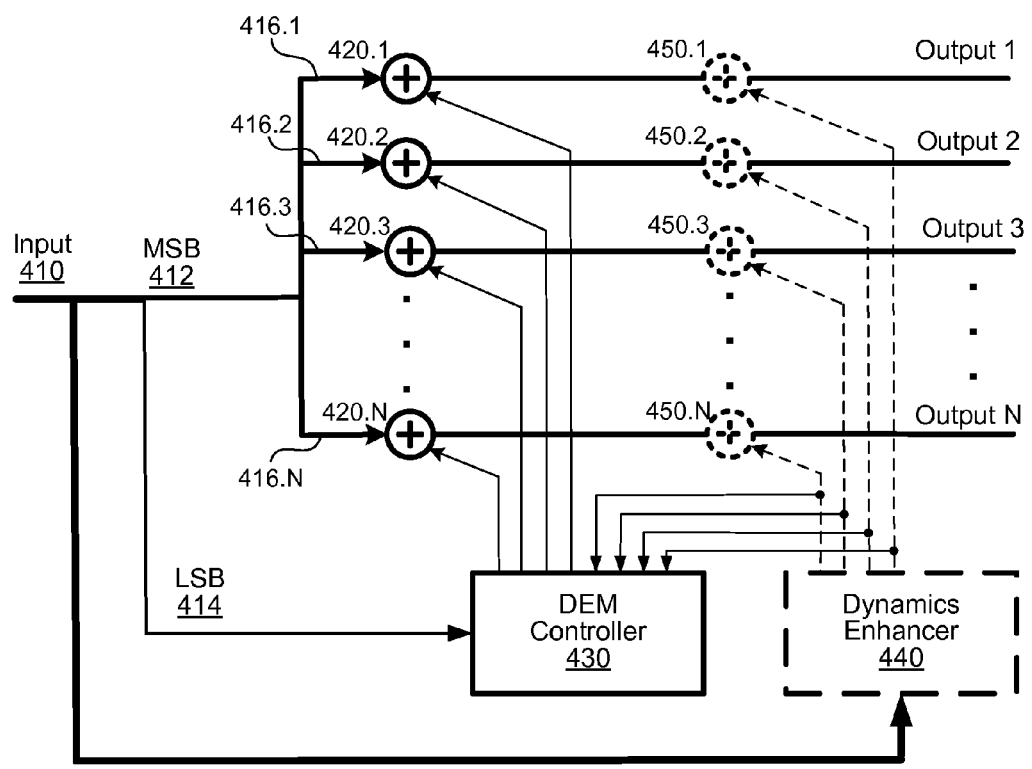
FIG. 4 illustrates architecture of an exemplary DEM DAC circuit that may find application with a DEM DAC circuit according to an exemplary embodiment of the present disclosure.

FIG. 4 illustrates architecture of an exemplary splitting circuit 400 that may find application with a DEM DAC circuit according to an exemplary embodiment of the present disclosure. One or more of the splitting circuits 300 may be included in each of the layers shown in FIG. 3. The splitting circuit 400 may include a plurality of branches 416.1-416.N, a DEM controller 430 and a plurality of adders 420.1-420.N. The splitting circuit may split the input signal 410 into each of the branches 416.1-416.N. The DEM controller 430 may perform dynamic element matching at each of the branches 416.1-416.N by adding values to signals in the one or more of the branches 416.1-416.N.

As shown in FIG. 4, the most significant bits 412 of the input signal 410 may be provided to each of the branches 416.1-416.N and the least significant bits 414 (e.g., two least significant bits) may be provided to the $2^{nd}$ order DEM controller 430. The $2^{nd}$ order DEM controller 430 may perform dynamic element matching by using the least significant bits to make a determination of whether to add a 1 or 0 to the word in the one or more of the branches 416.1-416.N. The 1 or 0 can be added to the word in the one or more of the branches 416.1-416.N via the respective adder 420.1-420.N. Performing the DEM on the least significant bits in such an arrangement allows for DEM to be effective even on low level signals.

The splitting circuit 400 may include a dynamics enhancer circuit 440 to increase the data activity. The input signal 410 may be provided to the dynamics enhancer circuit 440 to determine whether the data activity should be increased by adding signals to two or more of the branches 416.1-416.N. The dynamics enhancer circuit 440 can increase the data activity by adding a 1 to one or more branches and adding a −1 to the same number of branches via the respective adder 450.1-450.N.

As shown in FIG. 4, the DEM controller 430 receives the least significant bits of the input signal 410 and uses these bits to perform dynamic element matching on the split signals in the branches 416.1-416.N. The DEM controller 430 may add values to each of the branches 416.1-416.N. The DEM controller 430 may be a $2^{nd}$ order DEM and may perform vector based mismatch shaping. The DEM controller 430 may include a plurality of $2^{nd}$ order modulators (e.g., 4 modulators) and a vector quantizer to determine a value that should be provided to each of the branches 416.1-416.N.

The dynamics enhancer circuit 440 may process the input signal to determine if there is sufficient data activity in the input signal. If it is determined that there is not sufficient activity, the dynamics enhancer circuit 440 may alter values in two or more branches 416.1-416.N to increase the activities. The dynamics enhancer circuit 440 may increase the data activity while maintaining the digital value unchanged. For example, the dynamics enhancer circuit 440 may add a +1 to one branch of the circuit and a −1 to another branch of the circuit. The +1 may be added to the branch with the highest ranked word and the −1 may be added to the branch with the lowest ranked word. In another embodiment, to maximize data activity, the dynamics enhancer circuit 440 may add a +1 to half of the branches and a −1 to the other half of the branch. By increasing the data activity, the dynamics enhancer circuit 440 may increase the thermal noise in the circuit. However, the effectiveness of the mismatch shaping may be enhanced due to the operation of the dynamics enhancer circuit 440. The trade off is at the full control of the designer.

The level of activity may be determined based on the value of the least significant bits (e.g., two least significant bits) of the input signal 410 and/or by comparing the value of the input signal 410 to a predetermined value. For example, the level of activity may be determined to be not sufficient if the two least significant bits are zero. In another embodiment, the level of activity may be determined to be not sufficient if a predetermined number of least significant bits are zero and the input signal value is equal to or below a predetermined threshold. In another embodiment, the level of activity may be determined to be not sufficient if a predetermined number of least significant bits are zero and the input signal value is equal to or within the range of −3 and 3.

The dynamics enhancer circuit 440 may increase the data activity after detecting low data activity a predetermined number of times. For example, the dynamics enhancer circuit 440 may be configured to detect the low activities consecutively four times before increasing the data activity. In an embodiment with multiple layers, the number of times that the low activities that needs to be detected before increasing the data activity can be set to different values for each layer. For example, in the first layer the dynamics enhancer circuit 440 can be configured to increase the data activity each time low data activity is determined, and the second layer the dynamics enhancer circuit 440 can be set to increase the data activity if the low data activity is determined consecutively four times.

The number of branches 416.1-416.N in the Splitting circuit 400 may be based on the size of the input word, the number of layers having the DEM DAC circuits 400 or the hardware requirements. Hardware requirements may become high if the number of branches N is increased significantly. In one embodiment, shown below, the input signals can be split into four branches at each layer. Splitting the input signals into four branches may allow for manageable hardware requirements.

Although, the DEM controller 430 and the dynamics enhancer circuit 440 are shown separately in FIG. 4, the DEM controller 430 and the dynamics enhancer circuit 440 may be provided together and a combined signal from the DEM controller 430 and the dynamics enhancer circuit 440 can be sent to one or more of the branches 416.1-416.N via the respective adder 420.1-420.N. In such a configuration, the signal sent to the branches 416.1-416.N may be a −1, 0 or 1.

As discussed above with regard to FIG. 3, a plurality of splitting circuits 400 may be combined in a tree-structured pattern forming a plurality of layers. The number of layers in the combined architecture may depend on the number of branches and/or number of bits in the input signal.

FIGS. 5 and 6 illustrate exemplary splitting circuits that may find application with a DEM DAC circuit according to an exemplary embodiment of the present disclosure. FIG. 5 illustrates a first splitting circuit 400 and FIG. 6 illustrates a second splitting circuit 600 that may be combined to process a five bit input signal. The first DEM splitting circuit 500 and the second splitting circuit 600 may be used in a two layer architecture. In the first layer, a single first splitting circuit 500 may receive an input signal 510. In the second layer, each output of the first splitting circuit 500 may be provided as an input to a second splitting circuit 600. Thus, four second splitting circuits 600 may receive one of the outputs of the first splitting circuit 500.

The first splitting circuit 500, shown in FIG. 5, may include four branches 516.1-516.4, $2^{nd}$ order DEM controller 530, dynamic enhancing circuit 540, and adders 520.1-520.4 and 550.1-550.4. The 5 bit input signal may be split into the 3 most significant bits 512 which are provided to each of the four branches 516.1-516.4 and into the 2 least significant bits 514 which are provided to the $2^{nd}$ order DEM controller 530. The input signal may also be provided to the dynamic enhancing circuit 540.

The $2^{nd}$ order DEM controller 530 may perform dynamic element matching by using the two least significant bits of the input signal to determine whether to add a 1 or 0 to each of the branches 516.1-516.4. The 1 or 0 can be added to the word in the branches 516.1-516.4 via the respective adder 520.1-520.4.

The first splitting circuit 500 may include a dynamics enhancer circuit 540 to increase the data activity. The dynamics enhancer circuit 540 receives is configured to determine based on the input signal 510 whether the data activity should be increased by adding signals to two or more of the branches 516.1-516.4. The dynamics enhancer circuit 540 can increase the data activity by adding a 1 to one or more branches and adding a −1 to the same number of branches via the respective adder 550.1-550.4. As discussed above with regard to FIG. 4, the dynamics enhancer circuit 540 may delay adding the values to the branches until the low data activity is detected for a predetermined number of input signals.

After the dynamic element matching and dynamics enhancement, the output signal 560 from each of the branches 516.1-516.4 in the splitting circuit 500 is a four bit signal. Each of the output signals 560 can be provided to a second splitting circuit 600, show in FIG. 6.

The second splitting circuit 600, shown in FIG. 6, may include four branches 616.1-616.4, $2^{nd}$ order DEM controller 630, and adders 620.1-620.4. The four bit input signal may be split into the 2 most significant bits 612 which are provided to each of the four branches 616.1-616.4 and into the 2 least significant bits 614 which are provided to the $2^{nd}$ order DEM controller 630. The input signal may also be provided to the dynamic enhancing circuit 640.

The $2^{nd}$ order DEM controller 630 may perform dynamic element matching by using the two least significant bits of the input signal to determine whether to add a 1 or 0 to each of the branches 616.1-616.4. The 1 or 0 can be added to the word in the branches 616.1-616.4 via the respective adder 620.1-620.4.

The second splitting circuit 600 may include an optional dynamics enhancer circuit 640 to increase the data activity. The dynamics enhancer circuit 640 is configured to determine based on the input signal 610 whether the data activity should be increased by adding signals to two or more of the branches 616.1-616.4. The dynamics enhancer circuit 640 can increase the data activity by adding a 1 to one or more branches and adding a −1 to the same number of branches via the respective adder 650.1-650.4.

Figure 7:
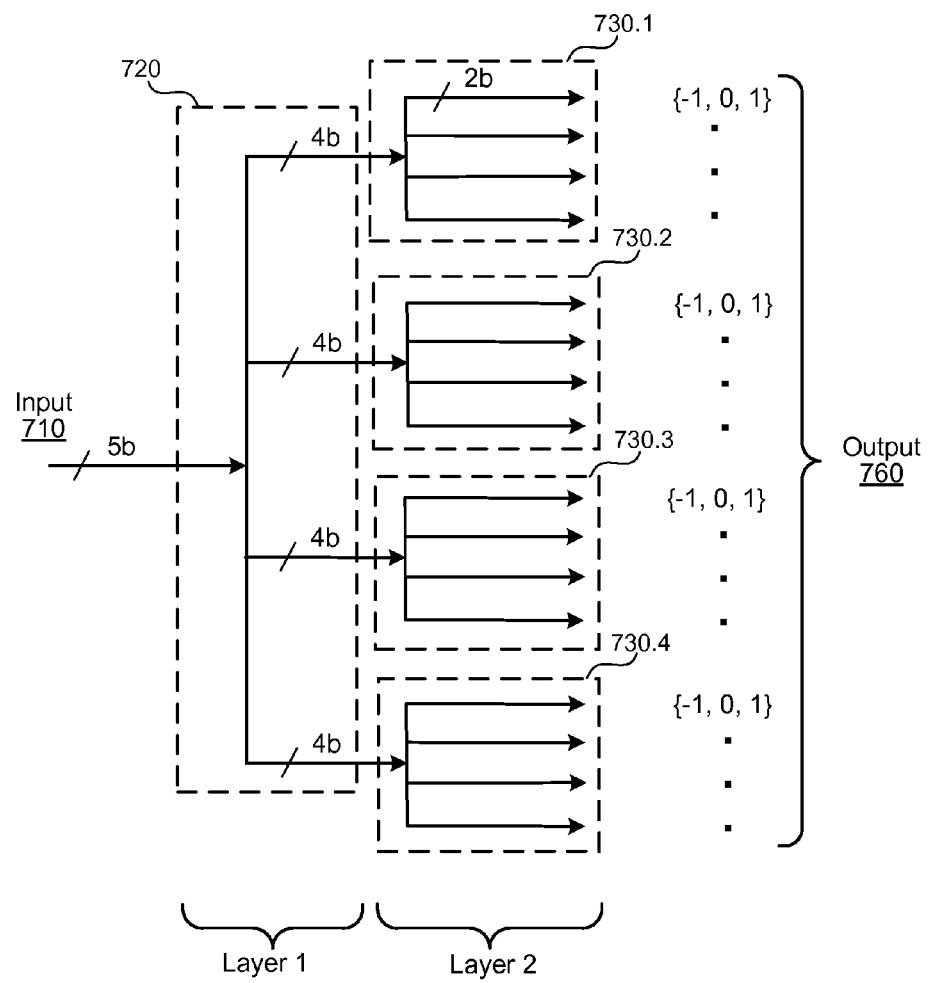
FIG. 7 illustrates a tree diagram of an input signal processed by the splitting circuits shown in FIGS. 5 and 6.

FIG. 7 illustrates a tree diagram of an input signal processed by the splitting circuits 500, 600 shown in FIGS. 5 and 6. The input signal 710 may be provided to a first layer in which a DEM DAC circuit 720, which can be a splitting circuit 500 shown in FIG. 5, performs noise shaped splitting of the input signal 710. The 5 bit input signal can be split into four branches and after dynamic element matching and/or dynamics enhancement a four bit signal is generated at each of the outputs. The outputs of the first layer can be provided to a second layer, in which the output of each branch of the first layer is provided to a DEM DAC circuit 730.1-730.4 in the second layer. Each of the DEM DAC circuits 730.1-730.4 may be a splitting circuit 600 shown in FIG. 6. In each of the DEM DAC circuits 730.1-730.4, the 4 bit input signal can be split into four branches. After dynamic element matching and/or dynamics enhancement, a two bit signal is generated at each of the outputs 760. Each two bit output signal of the DEM DAC circuits 730.1-730.4 can be an element selection signal provided to a three level unit element that can be either positively selected, negatively selected or not selected.

Figure 8:
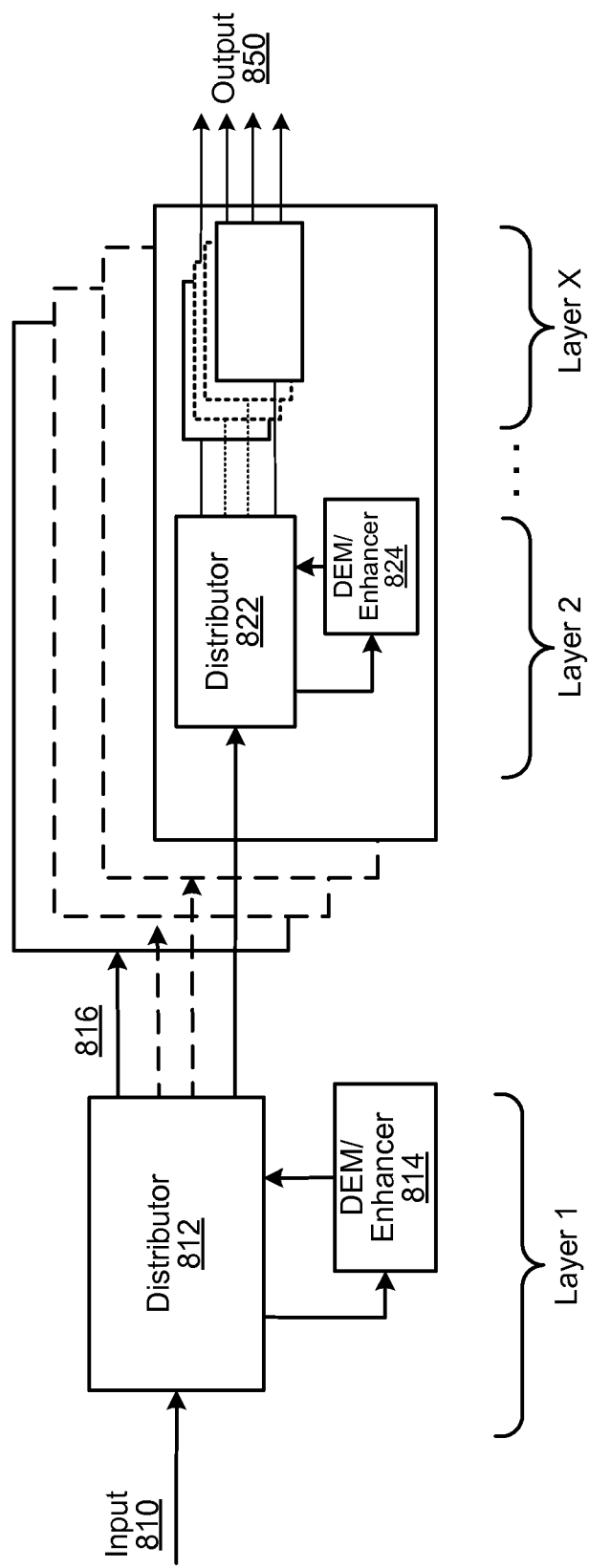
FIG. 8 illustrates architecture for a multi-layer DEM DAC circuit that may find application according to an exemplary embodiment of the present disclosure.

FIG. 8 illustrates architecture for a multi-layer DEM DAC circuit 800 that may find application according to an exemplary embodiment of the present disclosure. The multi-layer DEM DAC circuit 800 may include one or more DEM DAC circuits 400, shown in FIG. 4, in a plurality of layers (e.g., X layers). In each layer, the DEM DAC circuit may provide a cluster of outputs, each of which is provided as an input to a different DEM DAC circuit in the plurality of DEM DAC circuits in the next layer. Clusters of outputs 850 of the last layer X can be a two bit word, representing a three level signal (e.g., −1, 0, 1).

The first layer in the multi-layer DEM DAC circuit 800 may include a distributor 812 that receives a multi-bit input signal 810. The distributor 812 may provide the input signal to the DEM and/or the dynamics enhancer circuit 814 to perform dynamic element matching and/or dynamics enhancement on each branch in the distributor 812.

The output 816 at each of the branches in the distributor 812 may be provided to a different distributor 822 in the second layer. Each distributor 822 in the second layer may have a DEM and/or the dynamics enhancer circuit 824. The distributor 822 may provide the input signal to the DEM and/or the dynamics enhancer circuit 824 to perform dynamic element matching and/or dynamics enhancement on each branch in the distributor 822.

The last layer X, a distributor, DEM and a dynamics enhancer circuit may receive the output signal from the preceding layer and perform noise shaped splitting of the input signal and dynamic element matching and/or dynamics enhancement on each branch. The outputs 850 of the last layer X can be a two bit word, representing a three level signal (e.g., −1, 0, 1). The outputs 850 of the last layer X can be element selection signals provided to three level unit elements that are either positively selected, negatively selected or not selected.

Figure 9:
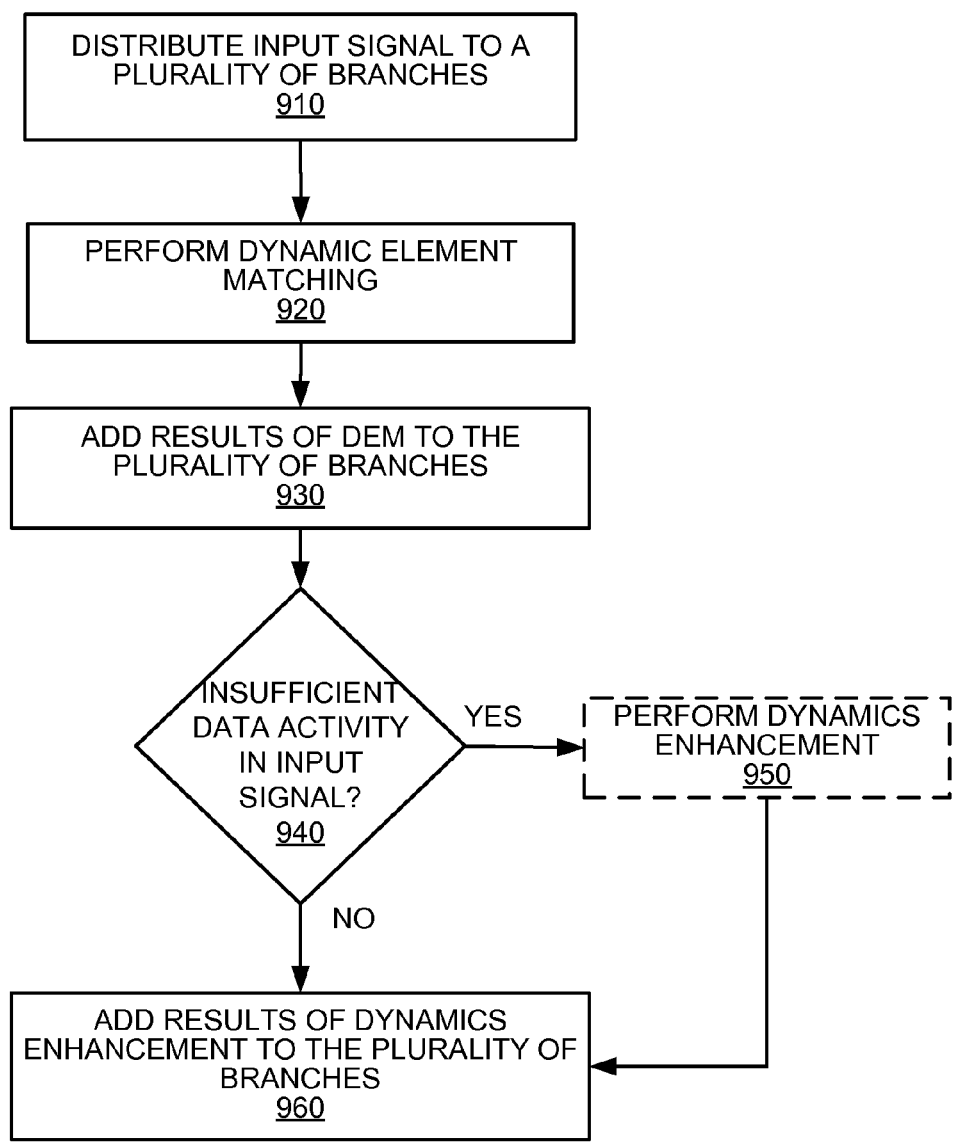
FIG. 9 illustrates a method for performing noise shaped splitting on an input signal according to an embodiment of the present invention.

FIG. 9 illustrates a method for performing noise shaped splitting on an input signal according to an embodiment of the present invention. As illustrated in FIG. 9, the method may include distributing the input signal to a plurality of branches (block 910). The most significant bits of the input signal can be distributed to the plurality of branches. The method may perform dynamic element matching based on the input signal (block 920). The least significant bits (e.g., two least significant bits) of the input signal may be used to perform the dynamic element matching. Based on the results of the dynamic element matching, a value (e.g., 0 or 1) can be added to the words in the plurality of branches (block 930).

The method may include performing dynamics enhancement (block 950). The dynamics enhancement may be performed if it is determined that there is insufficient data activity in the input signal (block 940). The dynamics enhancement (block 950) may increase the data activity while maintaining the digital value unchanged. For example, in the dynamics enhancement (block 950) a +1 may be added to one branch of the circuit and a −1 may be added to another branch of the circuit to maintain the digital value unchanged (block 960). The +1 may be added to the branch with the highest ranked word and the −1 may be added to the branch with the lowest ranked word. In another embodiment, to maximize data activity, a +1 may be added to half of the branches and a −1 may be added to the other half of the branch.

The method 900 may be performed by analyzing the signals at multiple layers. In a first layer, the method 800 may be performed on the input signal. In the next layer, the method 800 may be performed on each of the output signals from the first layer. In the last layer, the method may be performed such that the output signal is a two bit signal representing a three level signal (e.g., −1, 0, 1). Each of the output signals from the last layer can be an element selection signal provided to a three level unit element that can be either positively selected, negatively selected or not selected.

In the above description, for purposes of explanation, numerous specific details have been set forth in order to provide a thorough understanding of the inventive concepts. As part of this description, some structures and devices may have been shown in block diagram form in order to avoid obscuring the invention. Reference in the specification to "one embodiment" or "an embodiment" means that a particular feature, structure, or characteristic described in connection with the embodiment is included in at least one embodiment of the invention, and multiple references to "one embodiment" or "an embodiment" should not be understood as necessarily all referring to the same embodiment.

One or a plurality of the above illustrated operations of the methods described herein may be implemented in a computer program that may be stored on a storage medium having instructions to program a system to perform the operations. The storage medium may include, but is not limited to, any type of disk including floppy disks, optical disks, compact disk read-only memories (CD-ROMs), compact disk rewritable (CD-RWs), and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, magnetic or optical cards, or any type of media suitable for storing electronic instructions. Other embodiments may be implemented as software modules executed by a programmable control device.

As used in any embodiment in the present disclosure, "circuitry" may comprise, for example, singly or in any combination, analog circuitry, digital circuitry, hardwired circuitry, programmable circuitry, state machine circuitry, and/or firmware that stores instructions executed by programmable circuitry. Also, in any embodiment herein, circuitry may be embodied as, and/or form part of, one or more integrated circuits.

Although the methods illustrated and described herein include series of steps, it will be appreciated that the different embodiments of the present disclosure are not limited by the illustrated ordering of steps, as some steps may occur in different orders, some concurrently with other steps apart from that shown and described herein. In addition, not all illustrated steps may be required to implement a methodology in accordance with the present invention. Moreover, it will be appreciated that the processes may be implemented in association with the apparatus and systems illustrated and described herein as well as in association with other systems not illustrated.

It will be appreciated that in the development of any actual implementation (as in any development project), numerous decisions must be made to achieve the developers' specific goals (e.g., compliance with system and business related constraints), and that these goals will vary from one implementation to another. It will also be appreciated that such development efforts might be complex and time consuming, but would nevertheless be a routine undertaking for those of ordinary skill in art having the benefit of this disclosure.

We claim:

1. A digital to analog converter comprising:
    a plurality of unit cells, each providing an electrical signal to a common output at multiple levels in response to a respective control signal;
    a control system including a plurality of branches providing the control signals to corresponding unit cells, each branch receiving a plurality of most significant bits of an input signal; and
    a dynamic element matching circuit receiving a plurality of least significant bits of the input signal to generate respective output signals to the control system; wherein each branch includes a respective adder having inputs for the most significant bits of the input signal and a respective output from the dynamic element matching circuit,
    wherein the dynamic element matching circuit includes a dynamics enhancement circuit to increase data activity in the control signals provided by the plurality of branches to the plurality of unit cells.

2. The digital to analog converter of claim 1, wherein the dynamics enhancement circuit increases the data activity if it is determined that there is insufficient data activity in the input signal and the data activity is increased without changing the digital value represented by the control signals of the plurality of branches.

3. The digital to analog converter of claim 1, wherein the dynamics enhancement circuit increases the data activity in the control signals if it is determined that there is insufficient data activity in the input signal a predetermined number of times.

4. The digital to analog converter of claim 1, wherein
    the dynamics enhancement circuit to determine if there is sufficient level of data activity in the input signal; and
    a plurality of dynamics enhancement adders coupled to the plurality of branches, the dynamics enhancement circuit adding values to at least two of the branches via the dynamics enhancement adders if it is determined that there is insufficient level of data activity.

5. The digital to analog converter of claim 4, wherein if it is determined that there is insufficient level of data activity, values are added to each of the branches.

6. The digital to analog converter of claim 1, wherein the dynamic element matching circuit performs vector based mismatch shaping.

7. The digital to analog converter of claim 1, wherein based on the control signal each of the unit cells are either positively selected, negatively selected or not selected.

8. The digital to analog converter of claim 1, wherein the input signal is a four bit word and the control signal from each branch to the three element unit elements is a two bit word.

9. A multi-bit digital to analog converter comprising:
    a plurality of unit cells, each providing an electrical signal to a common output at multiple levels in response to a respective control signal;
    a control system having multiple layers of branch circuits, each branch circuit comprising:
    a dynamic element matching circuit receiving a plurality of least significant bits of the input code to generate respective output signals to the control system;
    a plurality of branches, each receiving most significant bits of an input code to the respective layer and having an adder for the most significant bits of the layer's input signal and a respective output from the dynamic element matching circuit; wherein:
    an input signal to the digital to analog converter is input to a first layer as that layer's input code,
    input codes of the other layers are taken from output signals of preceding layers, and
    output signals of a last layer may be input to the unit cells as control signals.

10. The multi-bit digital to analog converter of claim 9, wherein the unit cells are three level unit elements.

11. The multi-bit digital to analog converter of claim 10, wherein the three level unit elements are either positively selected, negatively selected or not selected based on the respective control signal.

12. The multi-bit digital to analog converter of claim 10, wherein:
the control system includes two layers;
the input signal is a five bit word; and
the control signal from each second level branch to the three element unit elements is a two bit word.

13. The multi-bit digital to analog converter of claim 9, wherein the first layer of the control system further comprises a dynamics enhancement circuit to increase data activity in the first layer output signals provided by the plurality of branches in the first layer.

14. The multi-bit digital to analog converter of claim 13, wherein the dynamics enhancement circuit determines if there is sufficient level of data activity in the input signal and increases the data activity in the first layer output signals if it is determined that there is insufficient data activity in the input signal a predetermined number of times.

15. The multi-bit digital to analog converter of claim 14, wherein if it is determined that there is insufficient level of data activity, values are added to each of the branches in the first layer.

16. The multi-bit digital to analog converter of claim 9, wherein each layer in the control system further comprises a dynamics enhancement circuit to increase data activity in the input code.

17. The multi-bit digital to analog converter of claim 16, wherein the dynamics enhancement circuit determines if there is sufficient level of data activity in the input code and increases the data activity in the control signals if it is determined that there is insufficient data activity a predetermined number of times.

18. The multi-bit digital to analog converter of claim 9, wherein the dynamic element matching circuits perform vector based mismatch shaping.

19. A multi-bit digital to analog converter comprising:
a first layer comprising:
a first control system including four first layer branches, each branch receiving three most significant bits of an input signal and providing a first layer output signal,
a first layer dynamic element matching circuit performing dynamic element matching based on the two least significant bits of the input signal and adding values to at least one of the first layer branches, and
a dynamics enhancement circuit to increase data activity in the first layer output signals by adding values to the first layer branches, if it is determined that there is insufficient data activity in the input signal; and
a second layer comprising four clusters of outputs, each cluster coupled to one of the first layer branches to receive one of the first layer output signals, each cluster of outputs comprising:
a second layer control system including four second layer branches, each branch receiving the two most significant bits of the first layer output signal and providing a second layer control signal,
a second layer dynamic element matching circuit performing dynamic element matching based on the least significant bits of the first layer output signal and adding values to at least one of the control signals in the second layer branches, and
four three level unit elements coupled to the second layer branches providing control signals.

20. The multi-bit digital to analog converter of claim 19, wherein the three level unit elements are either positively selected, negatively selected or not selected.

21. A method to perform noise shaped splitting of a digital input signal, comprising:
distributing the most significant bits of the input signal to a plurality of branches of a control system;
performing dynamic element matching based on the values of the least significant bits of the input signal;
adding the results of the dynamic element matching to the plurality of branches;
determining if there is insufficient data activity in the input signal;
if it is determined that there is insufficient data activity in the input signal, performing dynamics enhancement by adding values to the plurality of branches to increase the data activity while maintaining the digital value unchanged.

22. The method of claim 21, further comprising providing the outputs of the plurality of branches to a plurality of three level unit elements that are either positively selected, negatively selected or not selected based on the output value of each of the second set of branches.

23. The method of claim 21, further comprising:
distributing the most significant bits of an output signal of the plurality of branches to a second set of branches;
performing dynamic element matching based on the values of the least significant bits of the output signal;
adding the results of the dynamic element matching to the second set of branches; and
providing the outputs of the second set of branches to a plurality of three level unit elements that are either positively selected, negatively selected or not selected based on the output value of each of the second set of branches.

* * * * *